US011600675B2

(12) United States Patent
Kim et al.

(10) Patent No.: US 11,600,675 B2
(45) Date of Patent: Mar. 7, 2023

(54) DISPLAY DEVICE

(71) Applicant: Samsung Display Co., LTD., Yongin-si (KR)

(72) Inventors: Min Joo Kim, Bucheon-si (KR); Sun Ho Kim, Seongnam-si (KR); Seung-Hwan Cho, Yongin-si (KR); Tae Woo Kim, Seoul (KR); Tae Hoon Yang, Yongin-si (KR); Jong Hyun Choi, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 241 days.

(21) Appl. No.: 17/082,814

(22) Filed: Oct. 28, 2020

(65) Prior Publication Data

US 2021/0134907 A1 May 6, 2021

(30) Foreign Application Priority Data

Nov. 1, 2019 (KR) .......................... 10-2019-0138608

(51) Int. Cl.
*H01L 27/32* (2006.01)

(52) U.S. Cl.
CPC ........ *H01L 27/3248* (2013.01); *H01L 27/323* (2013.01); *H01L 27/3223* (2013.01); *H01L 27/3258* (2013.01); *H01L 27/3276* (2013.01)

(58) Field of Classification Search
CPC .............. G09G 3/3611; G09G 3/3655; G09G 2300/0413; G09G 2300/0426; H01L 27/3223

See application file for complete search history.

(56) References Cited

U.S. PATENT DOCUMENTS

| 2011/0063267 A1* | 3/2011 | Sim ...................... H01L 27/3223 345/205 |
| 2014/0183567 A1* | 7/2014 | Han ...................... H01L 27/3223 438/28 |
| 2018/0026080 A1 | 1/2018 | Lee et al. |

(Continued)

FOREIGN PATENT DOCUMENTS

KR    10-2018-0125061    11/2018

OTHER PUBLICATIONS

Extend European Search Report corresponding to European Patent Application NoJPatent No. 20204766.8 dated Feb. 25, 2021.

*Primary Examiner* — Kevin M Nguyen
(74) *Attorney, Agent, or Firm* — Kile Park Reed & Houtteman PLLC

(57) ABSTRACT

A display device includes a first display area and a second display area adjacent to the first display area in a first direction, driving elements, light-emitting elements including a pixel electrode electrically connected to a corresponding one of the driving elements, signal wirings that transfer a driving signal to the driving elements, and connection wirings that transfer a driving signal to signal wirings disposed in the second display area. At least one of the connection wirings includes a first signal-transferring portion extending in the first direction, a second signal-transferring portion extending in a second direction, and dummy portions extending in a direction intersecting the first and second signal-transferring portions. The pixel electrode overlaps a gap between dummy portions of adjacent connection wirings in an area where the connection wirings are disposed.

26 Claims, 16 Drawing Sheets

(56) References Cited

U.S. PATENT DOCUMENTS

| | | | |
|---|---|---|---|
| 2018/0107082 A1* | 4/2018 | Sasaki | H05K 1/18 |
| 2019/0042047 A1* | 2/2019 | Liao | G09G 3/3648 |
| 2019/0369430 A1* | 12/2019 | Obinata | H01L 27/124 |

* cited by examiner

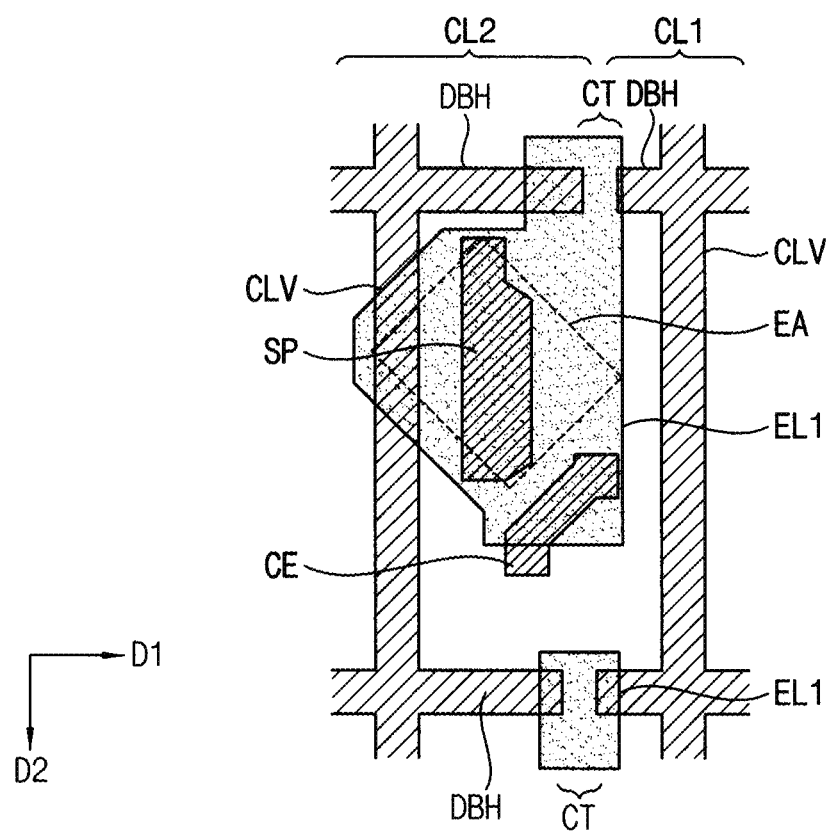

DISPLAY DEVICE

CROSS-REFERENCE TO RELATED APPLICATIONS

This application claims priority to and benefits of Korean Patent Application No. 10-2019-0138608 under 35 U.S.C. § 119 filed on Nov. 1, 2019, in the Korean Intellectual Property Office, the entire contents of which are incorporated herein by reference.

BACKGROUND

1. Technical Field

Embodiments relate to a display device.

2. Description of the Related Art

A display device generally includes a display area and a peripheral area, which may be a non-display area, surrounding the display area. Recently, a display device having a corner having a round or chamfered shape or displaying an image through a side surface is being developed.

In order to reduce the peripheral area, connection wirings may pass through a portion of the display area to transfer a signal to another portion of the display area. However, in this case, a pattern formed by a reflection difference between areas with and without the connection wirings may be perceived by users.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments provide a display device having a reduced bezel and improved display quality.

According to an embodiment, a display device may include a first display area and a second display area adjacent to the first display area in a first direction. The display device may include driving elements, light-emitting elements that may include a pixel electrode electrically connected to a corresponding one of the driving elements, signal wirings that transfer a driving signal to the driving elements, and connection wirings that transfer a driving signal to signal wirings disposed in the second display area. At least one of the connection wirings may include a first signal-transferring portion that may extend in the first direction, a second signal-transferring portion that may extend in a second direction, and dummy portions that may extend in a direction intersecting the first and second signal-transferring portions. The pixel electrode may overlap a gap between dummy portions of adjacent connection wirings in an area where the connection wirings may be disposed.

In an embodiment, the display device may further include dummy wirings disposed in an area where the connection wirings are not disposed, wherein at least one of the dummy wirings may include extending portions extending in the first direction and in the second direction.

In an embodiment, the pixel electrode may overlap a gap between extending portions of adjacent dummy wirings in the area where the dummy wirings may be disposed.

In an embodiment, the connection wirings and the dummy wirings may be disposed in a same layer.

In an embodiment, a constant voltage may be applied to the dummy wirings.

In an embodiment, a width of the gap may be in a range of about 1 μm to about 5 μm.

In an embodiment, the display device may further include a driving voltage line overlapping a portion of the connection wirings and extending in the second direction.

In an embodiment, the display device may further include an organic insulation layer disposed between the pixel electrode and the connection wirings. A thickness of the organic insulation layer may be in a range of about 20,000 Å to about 35,000 Å.

In an embodiment, the organic insulation layer may include a lower insulation layer and an upper insulation layer.

In an embodiment, the signal wirings may transfer a data signal to the driving elements.

In an embodiment, the signal wirings may be disposed below the connection wirings.

In an embodiment, the display device may further include a touch-sensing part disposed on the light-emitting elements. The touch-sensing part may include a sensing conductive pattern which may overlap the gap.

In an embodiment, a width of the sensing conductive pattern may be greater than a width of the gap.

In an embodiment, the display device may further include pad electrodes adjacent to the first display area in the second direction. The connection wirings may be electrically connected to the pad electrodes.

In an embodiment, the second display area may display an image in a direction different from the first display area.

According to an embodiment, a display device may include a first display area and a second display area adjacent to the first display area in a first direction. The display device may include driving elements, light-emitting elements that may include a pixel electrode electrically connected to a corresponding one of the driving elements, signal wirings that transfer a driving signal to the driving elements, and connection wirings that transfer a driving signal to signal wirings disposed in the second display area. At least one of the connection wirings may include a signal-transferring portion and a dummy portion. The signal-transferring portion and the dummy portion may extend in different directions to form a matrix having a disconnection portion. The pixel electrode may overlap the disconnection portion in an area where the connection wirings are disposed.

In an embodiment, a gap between a dummy portion of a first connection wiring and a signal-transferring portion of a second connection wiring adjacent to the first connection wiring may be the disconnection portion.

In an embodiment, a gap between a dummy portion of a first connection wiring and a dummy portion of a second connection wiring adjacent to the first connection wiring may be the disconnection portion.

In an embodiment, at least one of the connection wirings may include a first signal-transferring portion extending in the first direction, and a second signal-transferring portion extending in a second direction. The dummy portion may extend in a direction perpendicular to at least one of the first signal-transferring portion and the second signal-transferring portion.

In an embodiment, the display device may further include dummy wirings disposed in an area where the connection wirings may not be disposed. At least one of the dummy wirings may include extending portions extending in different directions to form a matrix having a disconnection portion.

In an embodiment, the pixel electrode may overlap the disconnection portion of the dummy wirings in the area where the dummy wirings are disposed.

In an embodiment, the connection wirings and the dummy wirings may be disposed in a same layer.

In an embodiment, a constant voltage may be applied to the dummy wirings.

In an embodiment, the display device may further include an organic insulation layer disposed between the pixel electrode and the connection wirings, wherein a thickness of the organic insulation layer may be in a range of about 20,000 Å to about 35,000 Å.

In an embodiment, the organic insulation layer may include a lower insulation layer and an upper insulation layer.

In an embodiment, the display device may further include a touch-sensing part disposed on the light-emitting elements and including a sensing conductive pattern, and the sensing conductive pattern may overlap the disconnection portion.

According to embodiments, a display device may include a connection wiring passing through a display area. Thus, the display device may have reduced bezel. Furthermore, an area where the connection wiring is disposed may be prevented from being visually distinguished from other area where the connection wiring in not disposed.

BRIEF DESCRIPTION OF THE DRAWINGS

Aspects of one or more embodiments will be more clearly understood from the following detailed description taken in conjunction with the accompanying drawings in which:

FIGS. 5A, 5B and 5C are plan views illustrating the first to fourth pixel areas of the display device of FIG. 2.

DETAILED DESCRIPTION OF THE EMBODIMENTS

Figure 1:
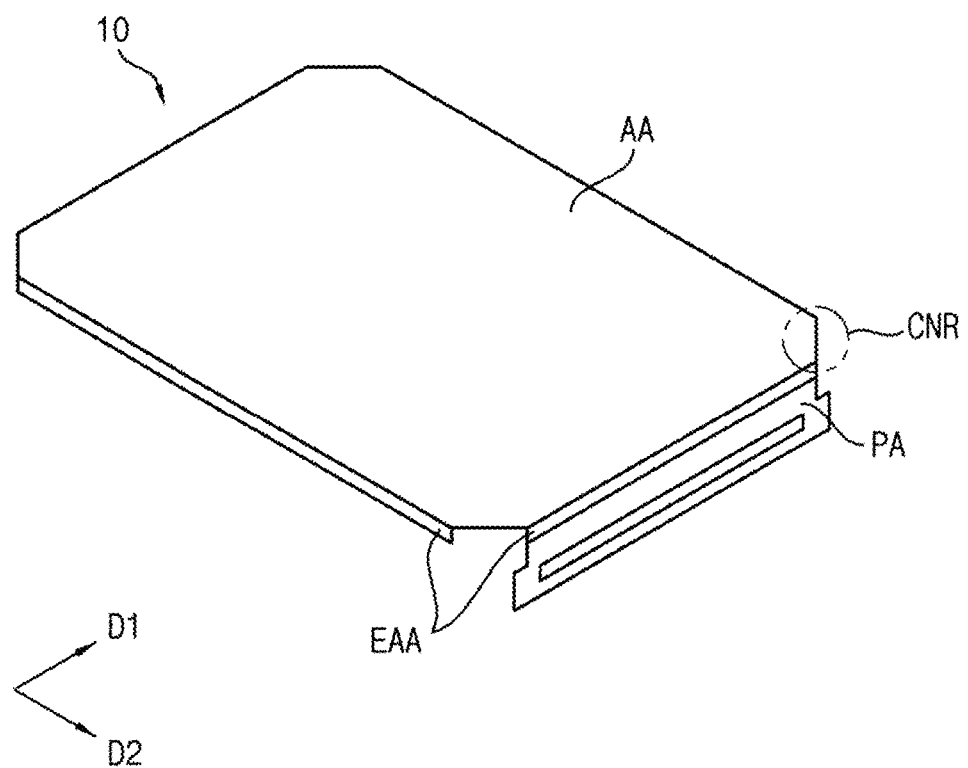
FIG. 1 is a perspective view illustrating a display device according to an embodiment.

A display device and a method for manufacturing a display device according to embodiments will be described hereinafter with reference to the accompanying drawings, in which embodiments are shown. Same or similar reference numerals may be used for same or similar components.

Some of the parts which are not associated with the description may not be provided in order to describe embodiments of the disclosure and like reference numerals refer to like elements throughout the specification.

As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that although the terms "first," "second," etc. may be used herein to describe various components, these components should not be limited by these terms. These components are only used to distinguish one component from another. For example, a first element referred to as a first element in one embodiment may be referred to as a second element in another embodiment without departing from the scope of the appended claims.

As used herein, the singular forms "a," "an" and "the" are intended to include the plural forms as well, unless the context clearly indicates otherwise.

It will be further understood that the terms "comprises" and/or "comprising" "includes" and/or "including", "have" and/or "having" are used in this specification, they or it may specify the presence of stated features, integers, steps, operations, elements and/or components, but do not preclude the presence or addition of other features, integers, steps, operations, elements, components, and/or any combination thereof.

When a layer, film, region, substrate, or area, or element is referred to as being "on" another layer, film, region, substrate, or area, or element, it may be directly on the other film, region, substrate, or area, or element, or intervening films, regions, substrates, or areas, or elements may be present therebetween. Conversely, when a layer, film, region, substrate, or area, or element, is referred to as being "directly on" another layer, film, region, substrate, or area, or element, intervening layers, films, regions, substrates, or areas, may be absent therebetween. Further when a layer, film, region, substrate, or area, or element, is referred to as being "below" another layer, film, region, substrate, or area, or element, it may be directly below the other layer, film, region, substrate, or area, or element, or intervening layers, films, regions, substrates, or areas, or elements, may be present therebetween. Conversely, when a layer, film, region, substrate, or area, or element, is referred to as being "directly below" another layer, film, region, substrate, or area, or element, intervening layers, films, regions, substrates, or areas, or elements may be absent therebetween.

Further, "over" or "on" may include positioning on or below an object and does not necessarily imply a direction based upon gravity.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations Sizes of components in the drawings may be exaggerated for convenience of explanation. In other words, since sizes and thicknesses of components in the drawings are arbitrarily illustrated for convenience of explanation, the following embodiments are not limited thereto.

Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

In the specification, an expression such as "A and/or B" indicates A, B, or A and B. Also, an expression such as "at least one of A and B" indicates A, B, or A and B.

In embodiments below, when a component is referred to as being "on a plane," it is understood that a component is viewed from the top, and when a component is referred to as being "on a schematic cross section," it is understood that the component is vertically cut and viewed from the side.

It will be understood that when a layer, region, or component is referred to as being "connected" or "coupled" to another layer, region, or component, it may be "directly connected" or "directly coupled" to the other layer, region, or component and/or may be "indirectly connected" or "indirectly coupled" to the other layer, region, or component with other layers, regions, or components interposed therebetween. For example, it will be understood that when a layer, region, or component is referred to as being "electrically connected" or "electrically coupled" to another layer, region, or component, it may be "directly electrically connected" or "directly electrically coupled" to the other layer, region, or component and may be "indirectly electrically connected" or "indirectly electrically coupled" to the other layer, region, or component with other layers, regions, or components interposed therebetween.

Also, when an element is referred to as being "in contact" or "contacted" or the like to another element, the element may be in "electrical contact" or in "physical contact" with another element; or in "indirect contact" or in "direct contact" with another element.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that may not be perpendicular to one another.

Unless otherwise defined, all terms (including technical and scientific terms) used herein have the same meaning as commonly understood by one of ordinary skill in the art to which embodiments pertain. In addition, it will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
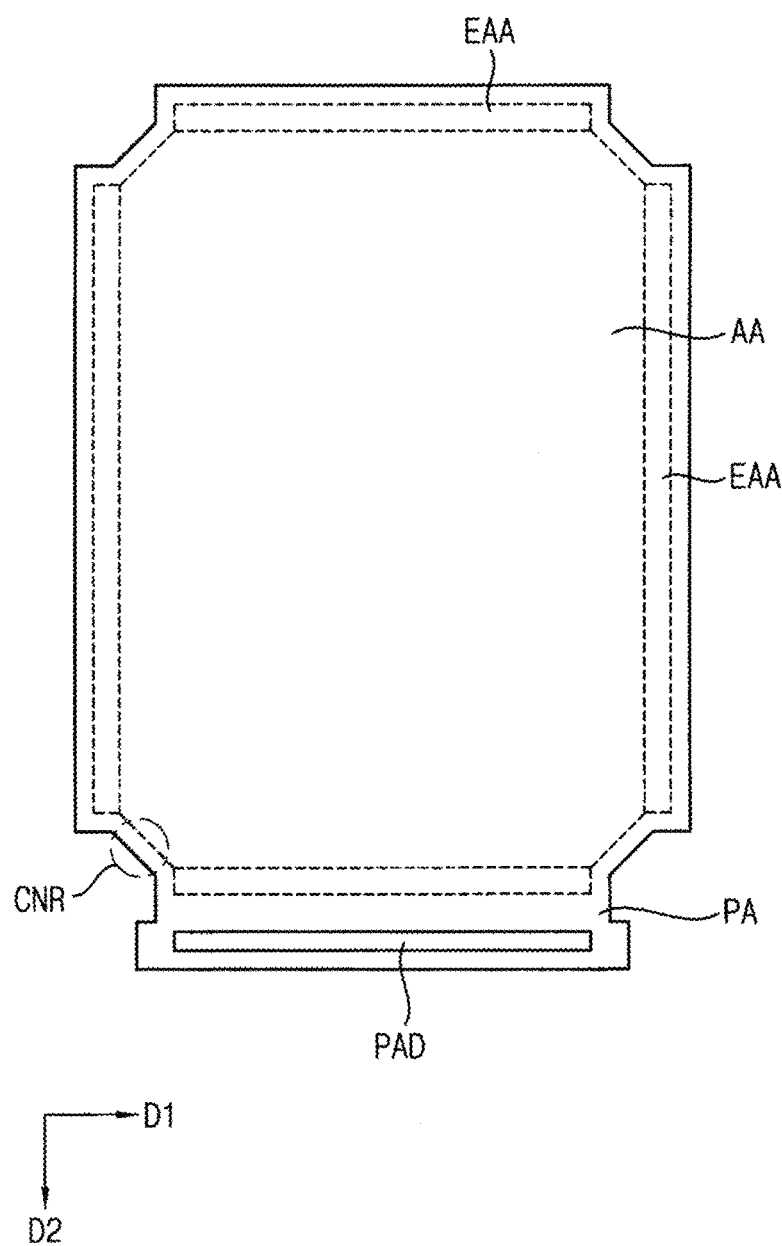
FIG. 2 is a planar view illustrating the display device of FIG. 1 in an unfolded state.

FIG. 1 is a perspective view illustrating a display device according to an embodiment. FIG. 2 is a planar view illustrating the display device of FIG. 1 in an unfolded state.

Referring to FIGS. 1 and 2, a display device 10 may include a display area, which displays an image, and a peripheral area PA surrounding or adjacent to the display area and not displaying an image.

An image may be displayed in the display area, and pixel areas may be arranged or disposed in the display area. In an embodiment, the display area may include a first display area AA and a second display area EAA.

For example, the first display area AA may have an entirely rectangular shape, of which corners CNR may have a chamfered shape. In an embodiment, although not shown, the corners CNR may have a substantially round shape.

In an embodiment, the first display area AA and the second display area EAA may display an image in different directions. For example, the first display area AA may be a front display area upwardly displaying an image, and the second display area EAA may be a side display area laterally displaying an image. For example, the second display area EAA may extend from edges of the first display area AA and may be bent with a curvature. For example, the second display area EAA may extend in a direction substantially perpendicular to a display surface of the first display area AA. As a result, the display device may implement a multi-directional display. In an embodiment, at least one of the second display areas EAA may be adjacent to the first display area AA in a first direction D1 in a case that the display device 10 may be unfolded.

In an embodiment, the display device 10 may include four side display areas. However, embodiments are not limited thereto. For example, a display device may include one, two or three side display areas.

The peripheral area PA may include a pad area PAD in which pad electrodes may be disposed. For example, the pad area PAD may be disposed at a side of the peripheral area PA. In an embodiment, the pad area PAD may have a shape extending in the first direction D1. Furthermore, the pad area PAD may be adjacent to the first display area AA in a second direction D2 substantially perpendicular to the first direction D1. The second display area EAA may be disposed between the pad area PAD and the first display area AA. However, embodiments are not limited thereto. For example, the second display area EAA may not be disposed between the pad area PAD and the first display area AA.

Figure 3:
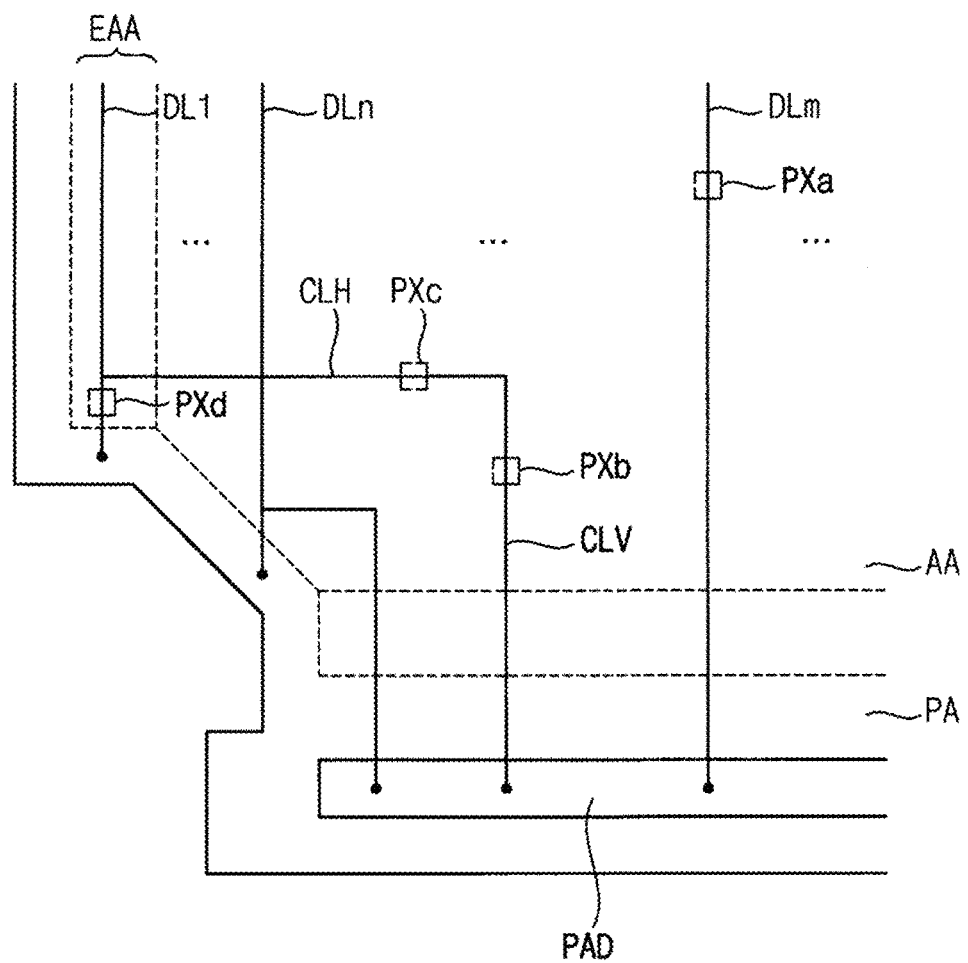
FIG. 3 is an enlarged view of a region of FIG. 2.
Figure 3:
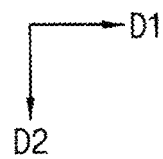

FIG. 3 is an enlarged view of a region of FIG. 2. As an example, FIG. 3 is an enlarged view of a lower left corner region of FIG. 2.

Referring to FIGS. 1 to 3, the display device my include signal wirings to provide a driving signal or a power to the display area. For example, the display device may include data lines DL1, DLn and DLm to provide a data signal to the display area. The display device may include connection wirings passing through the display area to transfer the data signal to a portion or a region of the data lines.

The data lines may extend in the second direction D2. The data lines may include a first data line DL1, an n-th data line DLn, and an m-th data line DLm. For example, n may be a natural number greater than or equal to 2, m may be a natural number greater than n.

The connection wirings may receive a data signal from the pad area PAD and may transfer the data signal to a portion of the data lines.

Each of the connection wirings may include a signal-transferring portion and a dummy portion. For example, a first connection wiring may include a first signal-transferring portion CLH and a second signal-transferring portion CLV, which may extend in different directions. For example, the first signal-transferring portion CLH may extend in the first direction D1, and the second signal-transferring portion CLV may extend in the second direction D2.

The signal-transferring portions may form a path to transfer the driving signal (the data signal). The dummy portions may extend from the signal-transferring portions in a different direction from the signal-transferring portions. A configuration of the dummy portions will be more fully explained in the following description.

For example, the first connection wiring may be electrically connected to the first data line DL1. In FIG. 3, the first connection wiring is shown as being in contact with the first data line DL1 (indicated by a dot on the drawing) in the non-display area and the corner CNR. However, embodiments are not limited thereto. For example, the first data line DL1 and the first signal-transferring portion CLH of the first connection wiring may electrically contact each other in the second display area EAA.

In an embodiment, the pixel areas may include a first pixel area PXa overlapping the m-th data line DLm in the first display area AA, a second pixel area PXb overlapping the second signal-transferring portion CLV of the first connection wiring in the first display area AA, a third pixel area PXc overlapping the first signal-transferring portion CLH of the first connection wiring in the first display area AA, and a fourth pixel area PXd overlapping the second signal-transferring portion CLV of the first connection wiring in the second display area EAA. Furthermore, the fourth pixel area PXd may overlap the first data line DL1.

The first pixel area PXa may be a pixel area where the connection wiring may not be disposed. The second to fourth pixel areas PXb, PXc and PXd may be pixel areas overlapping the connection wiring.

For example, the first connection wiring may include the first signal-transferring portion CLH and the second signal-transferring portion CLV. The first signal-transferring portion CLH may continuously extend in the first direction D1 in the first display area AA and the second display area EAA. The second signal-transferring portion CLV may extend in the second direction D2 in the first display area AA and in the second display area EAA.

In an embodiment, the first connection wiring may be electrically connected to the pad area PAD. A portion of the first connection wiring may be disposed in the first display area AA. Thus, a wiring that may transfer a driving signal to the first data line DL1 may not be disposed in a non-display area adjacent to the corner CNR. Thus, a size of the non-display area may be reduced.

Figure 4:
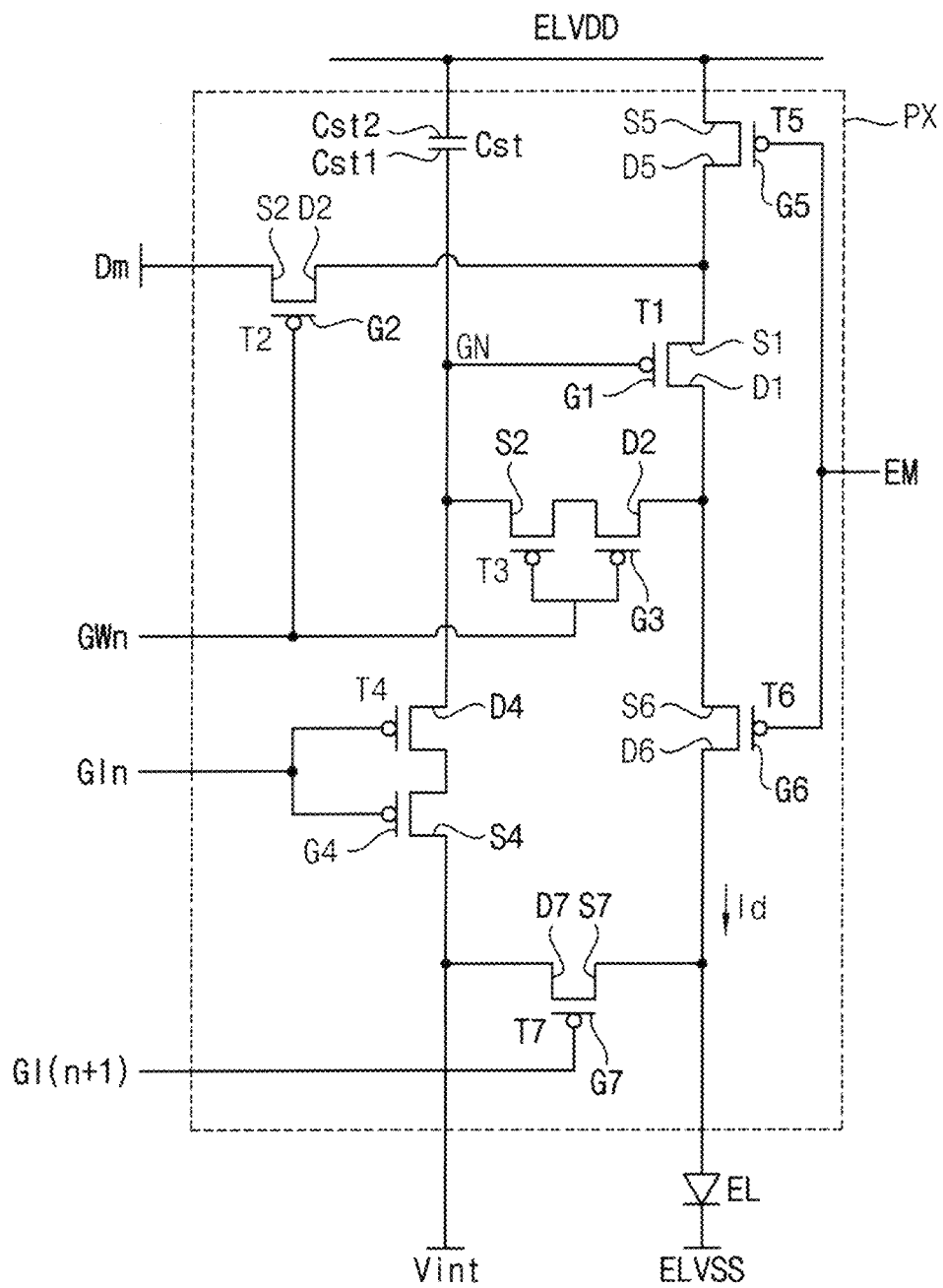
FIG. 4 is an equivalent circuit diagram of a pixel of a display device according to an embodiment.

FIG. 4 is an equivalent circuit diagram of a pixel of a display device according to an embodiment.

In an embodiment, as shown in FIG. 4, a display device may include pixels PX that may display an image corresponding to a video signal, and signal wirings. Each pixel PX may include transistors T1, T2, T3, T4, T5, T6 and T7 that may be electrically connected to the signal wirings, a capacitor Cst, and a light emitting diode EL. Herein, for convenience of description, an embodiment, in which each pixel PX may include a single light emitting diode EL, will be described, but embodiments are not limited thereto. In an embodiment, each pixel PX may include two or more light emitting diodes.

The signal wirings may include scan lines, control lines, data lines, and driving voltage lines.

The scan lines may respectively transmit scan signals GWn, Gin and GI(n+1). The scan signals GWn, Gin and GI(n+1) may transmit a gate on voltage and a gate off voltage that may turn on and turn off the transistors T2, T3, T4 and T7 included in each pixel PX.

The scan lines that may be electrically connected to one pixel PX may include a first scan line that may transmit the scan signal GWn, a second scan line that may have a gate on voltage at a different time from those of the first scan line and a third scan line, which may transmit the scan signal GI(n+1). Herein, for convenience of description, an embodiment, in which the second scan line may transmit a gate on voltage at a time prior to the first scan line will be described. In an embodiment, for example, the scan signal GWn may be an n-th scan signal (here, n may be a natural number greater than 1) among scan signals applied during one frame period, the scan signal GIn may be a previous scan signal such as an (n−1)-th scan signal, and the scan signal GI(n+1) may be an n-th scan signal, but not being limited thereto. In an embodiment, the scan signal GI(n+1) may be a scan signal other than the n-th scan signal.

The control line may transmit a control signal, for example, an emission control signal that may control emission of the light emitting diode EL included in the pixel PX. The control signal transmitted by the control line may transmit a gate on voltage and a gate off voltage, and may have a waveform that may be different from that of scan signals transmitted by the scan lines.

The data lines may transmit a data signal Dm, and the driving voltage line may transmit a driving voltage ELVDD. The data signal Dm may have a voltage level that may vary according to a video signal input to the display device, and the driving voltage ELVDD may have a substantially constant voltage level.

In an embodiment, as shown in FIG. 4, the transistors in each pixel PX may include a first transistor T1, a second transistor T2, a third transistor T3, a fourth transistor T4, a fifth transistor T5, a sixth transistor T6, and a seventh transistor T7.

In such an embodiment, the first scan line may transmit a scan signal GWn to the second transistor T2 and the third transistor T3, the second scan line may transmit a scan signal GIn to the fourth transistor T4, the third scan line may transmit a scan signal GI(n+1) to the seventh transistor T7, and the control line may transmit an emission control signal EM to the fifth transistor T5 and the sixth transistor T6.

A gate electrode G1 of the first transistor T1 may be electrically connected to a first end Cst1 of the capacitor Cst through a driving gate node GN, a source electrode S1 of the first transistor T1 may be electrically connected to the driving voltage line via the fifth transistor T5, and a drain electrode D1 of the first transistor T1 may be electrically connected to an anode of the light emitting diode EL via the sixth transistor T6. The first transistor T1 may receive the data signal Dm transmitted from the data line according to a switching operation of the second transistor T2, and may supply a driving current Id to the light emitting diode EL.

A gate electrode G2 of the second transistor T2 may be electrically connected to the first scan line, a source electrode S2 of the second transistor T2 may be electrically connected to the data line, and a drain electrode D2 of the second transistor T2 may be electrically connected to the driving voltage line via the fifth transistor T5 while being electrically connected to the source electrode S1 of the first transistor T1. The second transistor T2 may be turned on by the scan signal GWn received through the first scan line, and may transmit the data signal Dm received from the data line to the source electrode S1 of the first transistor T1.

A gate electrode G3 of the third transistor T3 may be electrically connected to the first scan line, and a source electrode S3 of the third transistor T3 may be electrically connected to the anode of the light emitting diode EL via the sixth transistor T6 while being electrically connected to the drain electrode D1 of the first transistor T1. A drain electrode D3 of the third transistor T3 may be electrically connected to a drain electrode D4 of the fourth transistor T4, the first end Cst1 of the capacitor Cst, and the gate electrode G1 of the first transistor T1. The third transistor T3 may be turned on according to the scan signal GWn received through the first scan line, and diode-connects the first transistor T1 by connecting the gate electrode G1 and the drain electrode D1 of the first transistor T1 to each other.

A gate electrode G4 of the fourth transistor T4 may be electrically connected to the second scan line, a source electrode S4 of the fourth transistor T4 may be electrically connected to an initialization voltage (Vint) terminal, and a drain electrode D4 of the fourth transistor T4 may be electrically connected to the first end Cst1 of the capacitor Cst and the gate electrode G1 of the first transistor T1 through the drain electrode D3 of the third transistor T3. The fourth transistor T4 may be turned on according to the scan signal GIn received through the second scan line, and may transmit the initialization voltage Vint to the gate electrode G1 of the first transistor T1 to perform an initialization operation to initialize a voltage of the gate electrode G1 of the first transistor T1.

A gate electrode G5 of the fifth transistor T5 may be electrically connected to the control line, a source electrode S5 of the fifth transistor T5 may be electrically connected to the driving voltage line, and a drain electrode D5 of the fifth transistor T5 may be electrically connected to the source electrode S1 of the first transistor T1 and the drain electrode D2 of the second transistor T2.

A gate electrode G6 of the sixth transistor T6 may be electrically connected to the control line, a source electrode S6 of the sixth transistor T6 may be electrically connected to the drain electrode D1 of the first transistor T1 and the source electrode S3 of the third transistor T3, and a drain electrode D6 of the sixth transistor T6 may be electrically connected to the anode of the light emitting diode EL. The fifth transistor T5 and the sixth transistor T6 may be concurrently (for example, simultaneously) turned on according to the light emission control signal EM received through the control line, and, thus, the driving voltage ELVDD may be compensated by the diode-connected first transistor T1 through the turned-on fifth and sixth transistors T5 and T6, and then the compensated driving voltage ELVDD may be transmitted to the light emitting diode EL.

A gate electrode G7 of the seventh transistor T7 may be electrically connected to the third scan line, a source electrode S7 of the seventh transistor T7 may be electrically connected to the drain electrode D6 of the sixth transistor T6 and the anode of the light emitting diode EL, and a drain electrode D7 of the seventh transistor T7 may be electrically connected to the initialization voltage Vint terminal and the source electrode S4 of the fourth transistor T4. In an embodiment, the gate electrode G7 of the seventh transistor T7 may be electrically connected to an additional control line (not shown).

In an embodiment, the transistors T1, T2, T3, T4, T5, T6 and T7 may be P-type channel transistors, such as a P-type metal-oxide-semiconductor ("PMOS") transistor and the like, but are not limited thereto. In an embodiment, at least one of the transistors T1, T2, T3, T4, T5, T6, and T7 may be an N-type transistor.

In an embodiment, as described above, the first end Cst1 of the capacitor Cst may be electrically connected to the gate electrode G1 of the first transistor T1, and a second end Cst2 of the capacitor Cst may be electrically connected to the driving voltage line. A cathode of the light emitting diode EL may be electrically connected to a common voltage ELVSS terminal that may transmit a common voltage ELVSS and may receive the common voltage ELVSS.

In an embodiment, the structure of the pixel PX is not limited to the structure shown in FIG. 4, and the number of transistors and the number of capacitors included in each pixel PX and a relationship therebetween may be variously modified.

Figure 5A:
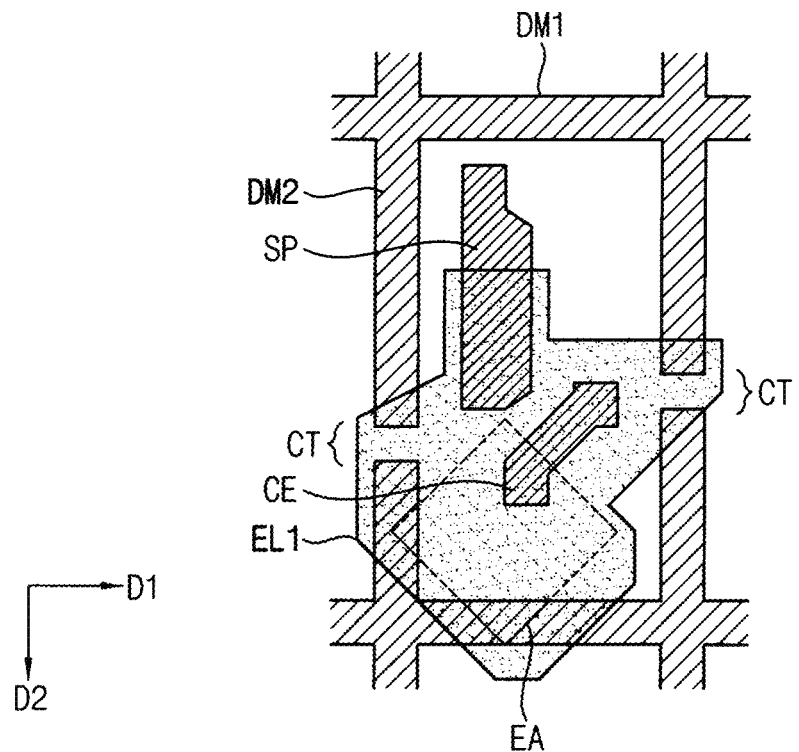
Figure 5C:
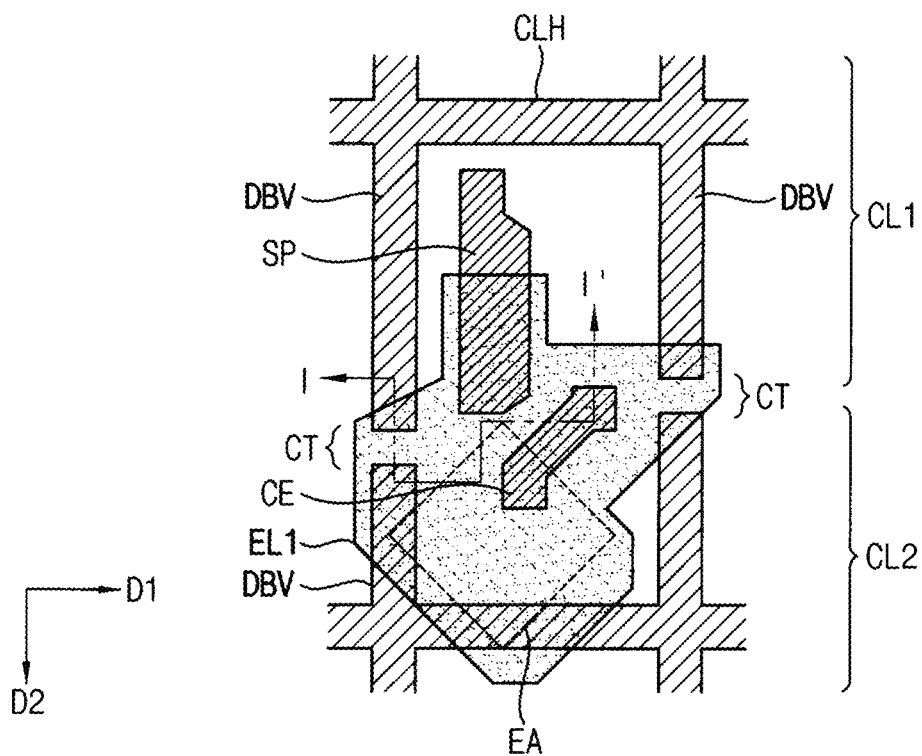

FIGS. 5A, 5B and 5C are plan view illustrating the first to fourth pixel areas of the display device of FIG. 2. FIG. 5A may illustrate the first pixel area, FIG. 5B may illustrate the second pixel area and the fourth pixel area, and FIG. 5C may illustrate the third pixel area. As an example, FIGS. 5A to 5C may illustrate a layout of a pixel electrode and a conductive pattern including the connection wiring.

Referring to FIG. 5A, a dummy wiring may be disposed in the first pixel area where the connection wiring may not be disposed. The dummy wiring may have an entirely matrix configuration. For example, the dummy wiring may include a first extending portion DM1 extending in a first direction D1 and a second extending portion DM2 extending in a second direction D2 substantially perpendicular to the first direction D1.

In an embodiment, the dummy wiring may include a disconnection portion CT. The disconnection portion CT may be defined by a gap between adjacent extending portions. For example, a second extending portion DM2 of the dummy wiring may be spaced apart from a second extending portion adjacent thereto in the second direction D2 thereby forming or defining the disconnection portion CT. However, embodiments are not limited thereto. For example, the disconnection portion CT may be defined by a gap between adjacent first extending portions DM1, or may include the gap between adjacent first extending portions DM1 and the gap between adjacent second extending portions DM2.

In an embodiment, a constant voltage may be applied to the dummy wiring to reduce affection of the dummy wiring to other signal wirings. For example, the driving voltage ELVDD may be applied to the dummy wiring.

Referring to FIGS. 5B and 5C, connection wirings disposed in the second to fourth pixel areas may have an entirely matrix configuration.

For example, a first connection wiring CL1 may include a first signal-transferring portion CLH extending in a first direction D1, and a second signal-transferring portion CLV extending in a second direction D2 substantially perpendicular to the first direction D1. Furthermore, the first connection wiring CL1 may include a first dummy portion DBV extending in the second direction D2 from the first signal-transferring portion CLH, and a second dummy portion DBH extending in the first direction D1 from the second signal-transferring portion CLV. For example, an area where the first signal-transferring portion CLH and the first dummy portion DBV may be disposed may have a substantially same or similar pattern shape as the dummy wiring illustrated in FIG. 5A.

The first connection wiring CL1 may be separated from a second connection wiring CL2 adjacent thereto by a disconnection portion CT. In an embodiment, the disconnection portion CT may be defined by a gap between adjacent dummy portions. For example, a first dummy portion DBV of the first connection wiring CL1 may be spaced apart from a first dummy portion DBV of the second connection wiring CL2 in the second direction D2. A second dummy portion DBH of the first connection wiring CL1 may be spaced apart from a second dummy portion DBH of the second connection wiring CL2 in the first direction D1.

In an embodiment, a width of the disconnection portion CT may be at most about 5 μm. In a case that a width of the disconnection portion CT is more than about 5 μm, it may be difficult to shield the disconnection portion CT. For example, a width of the disconnection portion CT may be in a range of about 1 μm to about 5 μm.

A light-emitting element may be disposed in each of the pixel areas. In an embodiment, the light-emitting element may include an organic light-emitting diode. For example, the light-emitting element may include a first electrode EL1, a second electrode and a light-emitting layer disposed between the first electrode EL1 and the second electrode. In an embodiment, the first electrode EL1 may be a pixel electrode having a pattern shape substantially corresponding to each of the pixel areas, and the second electrode may be a common electrode continuously overlapping the pixel areas. FIGS. 5A to 5C may illustrate the first electrode EL1 of the light-emitting element.

Referring to FIGS. 5A to 5C, a first electrode EL1 of the light-emitting element may overlap a disconnection portion CT of a dummy wiring or a disconnection portion CT of connection wirings CL1 and CL2 in each of pixel areas.

The first electrode EL1 may have different shapes depending on a pixel area. Furthermore, the first electrode EL1 may overlap one disconnection portion CT or at least two disconnection portions CT.

In an embodiment, the dummy wiring and the connection wirings may be formed from a same layer. Referring to FIGS. 5A to 5C, a conductive pattern including the dummy wiring and the connection wirings may include a connection electrode CE and a shielding pattern SP. The connection electrode CE may electrically connect the first electrode EL1 of the light-emitting element to a driving element. The shielding pattern SP may overlap a signal wiring or a portion of the driving element to prevent variation of a voltage or a capacitance. For example, a constant voltage such as the driving voltage ELVDD may be applied to the shielding pattern SP.

In an embodiment, a display device may include a connection wiring and a dummy wiring disposed in an area where the connection wiring may not be disposed. The connection wiring may include a dummy portion, and the dummy wiring may have a shape substantially the same as or similar to the connection wiring. For example, the connection wiring and the dummy wiring may have an entirely matrix configuration having a disconnection portion.

Thus, an area where the connection wiring may be disposed may be prevented from being visually distinguished from an area where the connection wiring may not be disposed.

In an embodiment, the connection wiring may extend in different directions depending on areas. Thus, position of the disconnection portion CT may be different depending on areas. Thus, an area where the first signal-transferring portion CLH may be visually distinguished from an area where the second signal-transferring portion CLV may be disposed.

In an embodiment, the first electrode EL1 of the light-emitting element may overlap the disconnection portions CT. Thus, a pattern due to positional difference of the disconnection portions CT may not be perceived. Furthermore, the first electrode EL1 may be expanded to widely cover or overlap the disconnection portions CT. Thus, the pattern may not be perceived even in a case that a viewing angle may be changed.

Figure 6:
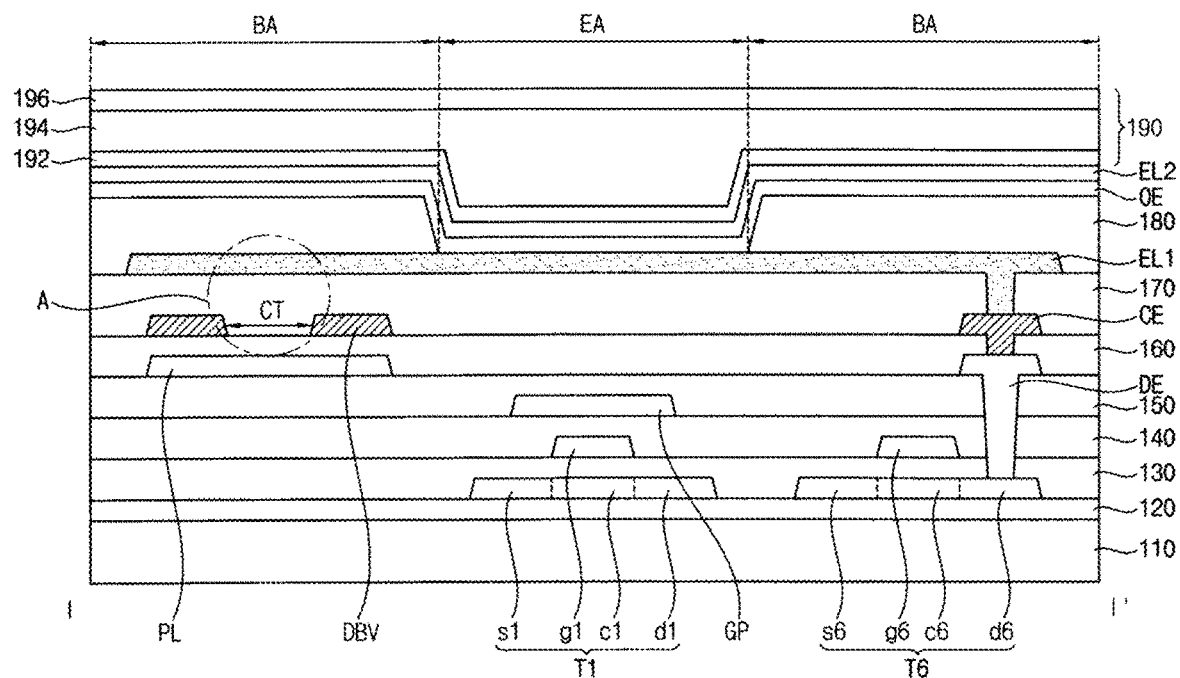
FIG. 6 is a schematic cross-sectional view taken along the line I-I' of FIG. 5C.
Figure 7:
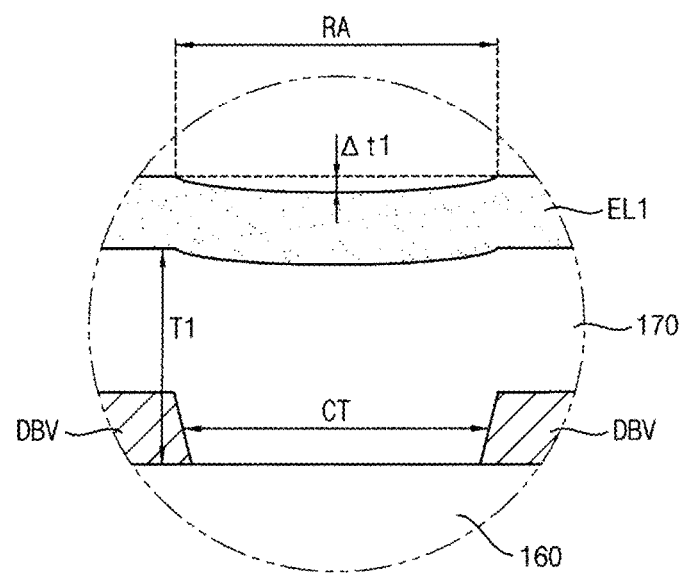
FIG. 7 is an enlarged schematic cross-sectional view illustrating the region 'A' of FIG. 6.
Figure 8:
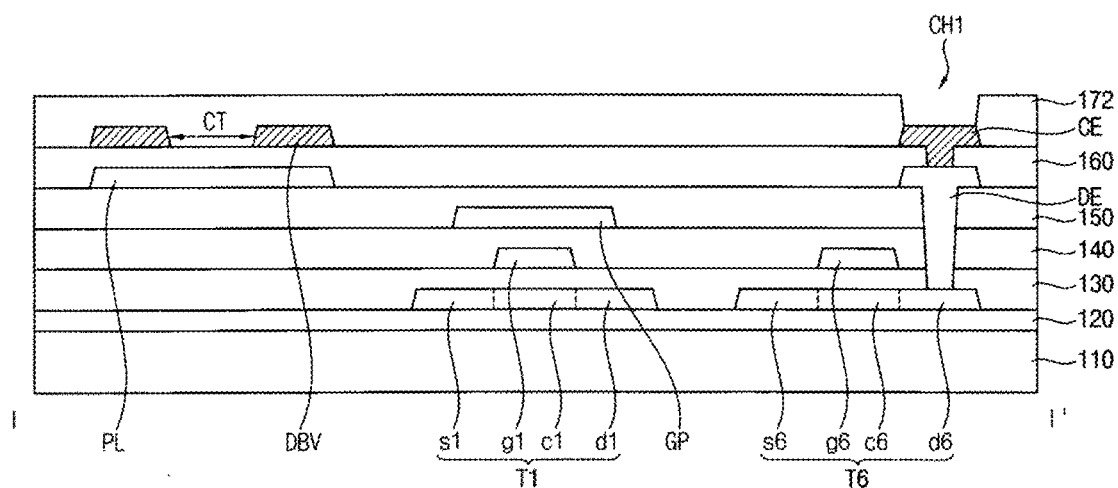
FIGS. 8 to 10 are schematic cross-sectional views illustrating a method for manufacturing a display device according to an embodiment.
Figure 9:
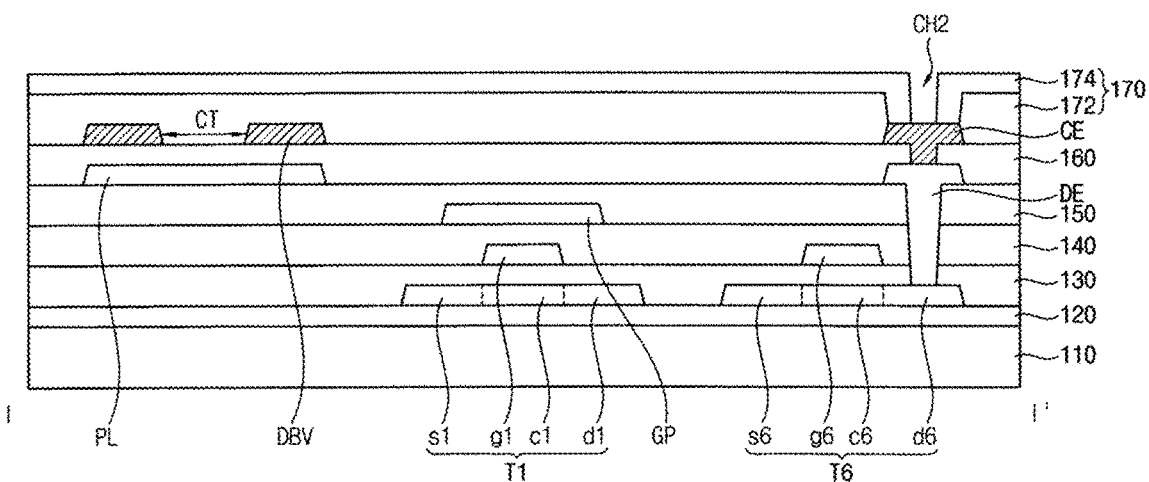
Figure 10:
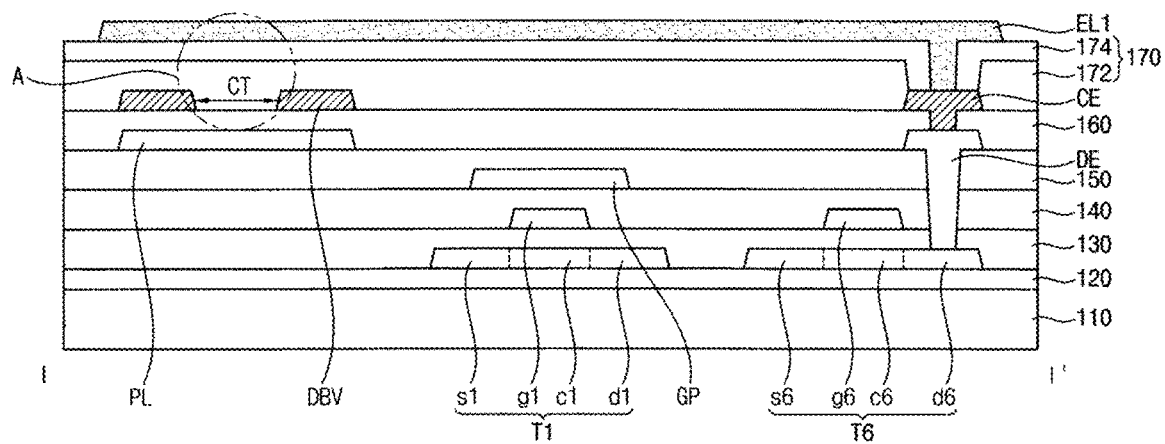
Figure 11:
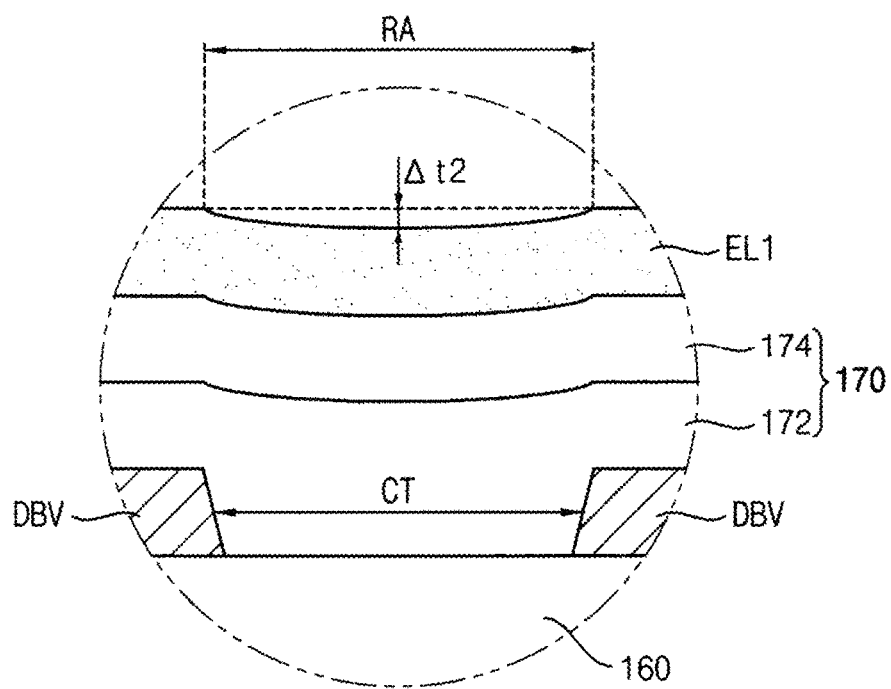
FIG. 11 is an enlarged schematic cross-sectional view illustrating the region 'A' of FIG. 10.

FIG. 6 is a schematic cross-sectional view taken along the line I-I' of FIG. 5C. FIG. 6 illustrates a schematic cross-sectional structure of a pixel area of a display device according to an embodiment. FIG. 7 is an enlarged schematic cross-sectional view illustrating the region 'A' of FIG. 6. FIGS. 8 to 10 are schematic cross-sectional views illustrating a method for manufacturing a display device according to an embodiment. FIG. 11 is an enlarged schematic cross-sectional view illustrating the region 'A' of FIG. 10.

Referring to FIG. 6, a pixel unit may include a driving element disposed on a base substrate 110 and a light-emitting element electrically connected to the driving element. In an embodiment, the light-emitting element may include an organic light-emitting diode. For example, FIG. 6 may illustrate the first transistor T1 and the sixth transistor T6, which are illustrated in FIG. 4.

A buffer layer 120 may be disposed on the base substrate 110. An active pattern may be disposed on the buffer layer 120.

For example, the base substrate 110 may include glass, quartz, sapphire, a polymeric material or the like within the spirit and the scope of the disclosure. In an embodiment, the base substrate 110 may include a transparent rigid material such as glass.

The buffer layer 120 may prevent or reduce the permeation of impurities, humidity or external gas from underneath of the base substrate 110, and may reduce a roughness of an upper surface of the base substrate 110. For example, the buffer layer 120 may include an inorganic material such as oxide, nitride or the like within the spirit and the scope of the disclosure.

The active pattern may include a channel area, a source area and a drain area. For example, the active pattern may include channel areas c1 and c6, source areas s1 and s6 electrically connected to the channel areas c1 and c6, and drain areas d1 and d6 electrically connected to the channel areas c1 and c6. The source areas s1 and s6 and the drain areas d1 and d6 may function as source electrodes and drain electrodes, respectively.

A first gate metal pattern including gate electrodes g1 and g6 may be disposed on the active pattern. A first insulation layer 130 may be disposed between the active pattern and the first gate metal pattern.

A second gate metal pattern including a gate wiring pattern GP may be disposed on the first gate metal pattern. The gate wiring pattern GP may include a capacitor electrode for forming a capacitor, a wiring that may transfer various signals or the like within the spirit and the scope of the disclosure. For example, the gate wiring pattern GP may overlap a gate electrode g1 of the first transistor T1.

A second insulation layer 140 may be disposed between the first gate metal pattern and the second gate metal pattern. A third insulation layer 150 may be disposed on the second gate metal pattern.

For example, the active pattern may include silicon or a metal oxide semiconductor. In an embodiment, the active pattern may include polycrystalline silicon (polysilicon), which may be doped with n-type impurities or p-type impurities.

In an embodiment or in another transistor that is not illustrated, an active pattern may include a metal oxide semiconductor. For example, the active pattern may include two-component compound (ABx), ternary compound (ABxCy) or four-component compound (ABxCyDz), which may contain indium (In), zinc (Zn), gallium (Ga), tin (Sn), titanium (Ti), aluminum (Al), hafnium (Hf), zirconium (Zr), magnesium (Mg). For example, the active pattern may include zinc oxide (ZnOx), gallium oxide (GaOx), titanium oxide (TiOx), tin oxide (SnOx), indium oxide (InOx), indium-gallium oxide (IGO), indium-zinc oxide (IZO), indium tin oxide (ITO), gallium zinc oxide (GZO), zinc magnesium oxide (ZMO), zinc tin oxide (ZTO), zinc zirconium oxide (ZnZrxOy), indium-gallium-zinc oxide (IGZO), indium-zinc-tin oxide (IZTO), indium-gallium-hafnium oxide (IGHO), tin-aluminum-zinc oxide (TAZO), indium-gallium-tin oxide (IGTO) or the like within the spirit and the scope of the disclosure.

The first insulation layer 130, the second insulation layer 140 and the third insulation layer 150 may include silicon oxide, silicon nitride, silicon carbide or a combination thereof. The first insulation layer 130, the second insulation layer 140 and the third insulation layer 150 may include an insulating metal oxide such as aluminum oxide, tantalum oxide, hafnium oxide, zirconium oxide, titanium oxide or the like within the spirit and the scope of the disclosure. For example, the first insulation layer 130, the second insulation layer 140 and the third insulation layer 150 may have a single-layered structure or a multi-layered structure including silicon nitride and/or silicon oxide, respectively, or may have different structures from each other.

The first and second gate metal patterns may include a metal, a metal alloy, a metal nitride, a conductive metal oxide or the like within the spirit and the scope of the disclosure. For example, the gate electrode g1 of the first transistor T1 and the gate wiring pattern GP may include gold (Au), silver (Ag), aluminum (Al), copper (Cu), nickel (Ni), platinum (Pt), magnesium (Mg), chromium (Cr), tungsten (W), molybdenum (Mo), titanium (Ti), tantalum (Ta) or an alloy thereof, and may have a single-layered structure or a multi-layered structure including different metal layers.

A first source metal pattern may be disposed on the third insulation layer 150. The first source metal pattern may include a source electrode and a drain electrode DE, which may electrically contact the active pattern. The source electrode and the drain electrode DE may pass through the insulation layers disposed thereunder to contact the active pattern, respectively. For example, the drain electrode DE may electrically contact a drain area d6 of the sixth transistor T6.

The first source metal pattern may include a driving voltage line PL transferring a driving voltage. For example, the driving voltage line PL may extend in the second direction D2, and may overlap the dummy wiring and the connection wirings illustrated in FIGS. 5A to 5C. Thus, the driving voltage line PL may overlap the disconnection portion CT. The first source metal pattern may include the data line illustrated in FIG. 3.

A fourth insulation layer 160 may be disposed on the first source metal pattern. A second source metal pattern may be disposed on the fourth insulation layer 160.

The second source metal pattern may include a connection electrode CE to electrically connect the drain electrode DE to the light-emitting element. The connection electrode CE may electrically contact the drain electrode DE and the first electrode EL1 of the light-emitting element. The second source metal pattern may include the dummy wiring, the connection wiring and the shielding pattern SP. The connection wiring may include a dummy portion DBV extending in a different direction from a signal-transferring portion. A gap between dummy portions DBV of adjacent connection wirings may define the disconnection portion CT.

A fifth insulation layer 170 may be disposed on the second source metal pattern.

The first and second source metal patterns may include a metal, a metal alloy, a metal nitride, a conductive metal oxide or the like within the spirit and the scope of the disclosure. For example, the first and second source metal patterns may include gold (Au), silver (Ag), aluminum (Al), copper (Cu), nickel (Ni), platinum (Pt), magnesium (Mg), chromium (Cr), tungsten (W), molybdenum (Mo), titanium (Ti), tantalum (Ta) or an alloy thereof, and may have a single-layered structure or a multi-layered structure including different metal layers. In an embodiment, the first and second source metal patterns may have a multi-layered structure including an aluminum layer.

The fourth insulation layer 160 and the firth insulation layer 170 may include an organic material. For example, the fourth insulation layer 160 and the firth insulation layer 170 may include an organic insulation material such as a phenol resin, an acryl resin, a polyimide resin, a polyamide resin, a siloxane resin, an epoxy resin or the like within the spirit and the scope of the disclosure. The fourth insulation layer 160 and the firth insulation layer 170 may be referred to as a via insulation layer or an organic insulation layer.

The light-emitting element may be disposed on the fifth insulation layer 170. The light-emitting element may include the first electrode EL1 electrically contacting the connection electrode CE, a light-emitting layer OE disposed on the first electrode EL1 and a second electrode EL2 disposed on the light-emitting layer OE. The light-emitting layer OE of the light-emitting element may be disposed at least in an opening of a pixel-defining layer 180 disposed on the fifth insulation layer 170. The light-emitting layer OE may continuously extend over the pixel areas or may have a pattern shape corresponding to the first electrode EL1.

The first electrode EL1 may function as an anode. For example, the first electrode EL1 may be formed as a transmitting electrode or a reflecting electrode according to an emission type of the display device. In a case that the first electrode EL1 is a transmitting electrode, the first electrode EL1 may include indium tin oxide, indium zinc oxide, zinc tin oxide, indium oxide, zinc oxide, tin oxide or the like within the spirit and the scope of the disclosure. In a case that the first electrode EL1 is a reflecting electrode, the first electrode EL1 may include gold (Au), silver (Ag), aluminum (Al), copper (Cu), nickel (Ni), platinum (Pt), magnesium (Mg), chromium (Cr), tungsten (W), molybdenum (Mo), titanium (Ti) or a combination thereof, and may have a stacked structure including the material that may be used for the transmitting electrode.

In an embodiment, the first electrode EL1 may be expanded to overlap the disconnection portion CT between the dummy portions DBV of the connection wirings.

The pixel-defining layer 180 may have the opening overlapping at least a portion of the first electrode EL1. For example, the pixel-defining layer 180 may include an organic insulating material.

The light-emitting layer OE may include at least an organic light-emitting layer, and may include at least one of a hole injection layer (HIL), a hole transporting layer (HTL), an electron transporting layer (ETL) and an electron injection layer (EIL). For example, the light-emitting layer OE may include a low molecular weight organic compound or a high molecular weight organic compound.

In an embodiment, the light-emitting layer OE may emit a red light, a green light or a blue light. In an embodiment, the light-emitting layer OE may emit a white light. The light-emitting layer OE emitting a white light may have a multi-layer structure including a red-emitting layer, a green-emitting layer and a blue-emitting layer, or a single-layer structure including a mixture of a red-emitting material, a green-emitting material and a blue-emitting material.

In a plan view, an area where the light-emitting layer OE and the first electrode EL1 may contact each other may define a light-emitting area EA. An area adjacent to the light-emitting area EA may define a non-light-emitting area BA. The non-light-emitting area BA may overlap the pixel-defining layer 180. In an embodiment, the connection wiring and the dummy wiring may be disposed in the non-light-emitting area BA.

The second electrode EL2 may function as a cathode. The second electrode EL2 may be formed as a transmitting electrode or a reflecting electrode according to an emission type of the display device. For example, the second electrode EL2 may include a metal, a metal alloy, a metal nitride, a metal fluoride, a conductive metal oxide or a combination thereof.

For example, the second electrode EL2 may be formed as a common layer extending continuously over the pixel areas.

An encapsulation layer 190 may be formed or disposed on the second electrode EL2. The encapsulation layer 190 may have a stacked structure of an inorganic thin film and an organic thin film. For example, the encapsulation layer 190 may include a first inorganic thin film 192, an organic thin film 194 disposed on the inorganic thin film 192 and a second inorganic thin film 196 disposed on the organic thin film 194.

For example, the organic thin film 194 may include a cured polymer resin such as poly(meth)acrylate or the like within the spirit and the scope of the disclosure. For example, the cured polymer resin may be formed by crosslinking reaction of monomers. For example, the inorganic thin films 192 and 196 may include silicon oxide, silicon nitride, silicon carbide, aluminum oxide, tantalum oxide, hafnium oxide, zirconium oxide, titanium oxide or a combination thereof.

Referring to FIG. 7, the fifth insulation layer 170 may not be flat. For example, an upper surface of the fifth insulation layer 170 may have a recess overlapping the disconnection portion CT of the dummy wiring or the connection wiring. Thus, an upper surface of the first electrode EL1 formed or disposed on the fifth insulation layer 170 may have a recess RA overlapping the disconnection portion CT of the dummy wiring or the connection wiring.

The recess RA may have a reflection characteristic different from an adjacent area thereto. For example, the adjacent area may overlap the dummy portion DBV. Thus, in a case that a difference of the reflection characteristics of the recess RA and the adjacent area, pixel areas having the recess RA at different positions may have different reflection characteristics thereby forming a visually perceived pattern.

In an embodiment, a thickness of the fifth insulation layer 170 may be increased to reduce a difference of the reflection characteristics of the recess RA and the adjacent area.

For example, the fifth insulation layer 170 may have a thickness of at least about 20,000 Å. In an embodiment, the thickness T1 of the fifth insulation layer 170 may be in a range of about 20,000 Å to about 35,000 Å and may be, for example, in a range of about 25,000 Å to about 30,000 Å. In a case that the thickness T1 of the fifth insulation layer 170 is less than about 20,000 Å, a reflection difference of the recess RA and the adjacent area may be increased. Thus, pixel areas having the recess RA at different positions may be perceived as a pattern. In a case that the thickness T1 of the fifth insulation layer 170 is excessively large, patterning the fifth insulation layer 170 and forming a contact hole may be difficult.

In an embodiment, a depth Δt1 of the recess RA of the first electrode EL1 may be at most about 50 nm, and may be preferably at most about 30 nm. In a case that the depth Δt1 of the recess RA of the first electrode EL1 is more than about 50 nm, a reflection difference of the recess RA and the adjacent area may be so large that a difference in areas having the disconnection portion CT at different positions may be recognized as a pattern. Thus, pixel areas having the recess RA at different positions may be perceived as a pattern.

In an embodiment, the fifth insulation layer 170 may have a multi-layered structure to reduce of the depth Δt1 of the recess RA.

For example, referring to FIG. 8, a lower insulation layer 172 may be formed or disposed to cover or overlap a second source metal pattern. For example, a photoresist composition may be coated on the second source metal pattern and a fourth insulation layer 160, and then exposed to a light and developed to form the lower insulation layer 172. The lower insulation layer 172 may have a first contact hole CH1 exposing a drain electrode DE of the second source metal pattern.

Referring to FIG. 9, an upper insulation layer 174 may be formed or disposed on the lower insulation layer 172. For example, a photoresist composition may be coated on the lower insulation layer 172, and then exposed to a light and developed to form the upper insulation layer 174.

The upper insulation layer 174 may have a second contact hole CH2 overlapping the first contact hole CH1.

Referring to FIG. 10, a conductive layer may be formed or disposed on the fifth insulation layer 170 including the lower insulation layer 172 and the upper insulation layer 174, and patterned to form a first electrode EL1. The first electrode EL1 may electrically contact the connection electrode CE through the second contact hole CH2. Furthermore, the first electrode EL1 may overlap a disconnection portion CT between dummy portions DBV of dummy wirings adjacent to each other.

Referring to FIG. 11, the depth Δt2 of the recess RA of the first electrode EL1 formed or disposed on the fifth insulation layer 170 having a multi-layered structure may be less than the depth Δt1 of the recess RA of the first electrode EL1 formed or disposed on the fifth insulation layer 170 having a single-layered structure and having a same thickness. Thus, a pattern perceived due to a reflection difference of the recess RA and the adjacent area may be effectively prevented.

Samples were prepared to evaluate an effect for preventing a pattern depending a thickness and a layered structure of a via insulation layer disposed between a first electrode and a conductive pattern including a connection wiring.

By way of example, samples having a configuration illustrated in FIG. 5 and having different thicknesses and layered structures for a fifth insulation layer 170 were prepared. Example 1 was prepared to include a fifth insulation layer having a thickness of about 15,000 Å and a single-layered structure. Example 2 was prepared to include a fifth insulation layer having a thickness of about 28,000 Å and a single-layered structure. Example 3 was prepared to include a fifth insulation layer having a thickness of about 28,000 Å and a double-layered structure formed through a two-step process. A height difference of a first electrode EL1 between an area overlapping a disconnection portion CT and an area overlapping a dummy portion DBV in Examples 1 to 3 was measured and represented in the following Table 1.

TABLE 1

|  | Example 1 | Example 2 | Example 3 |
| --- | --- | --- | --- |
| Approximate Height Difference (nm) | 188.4 | 85.63 | 17.13 |

Figure 12A:
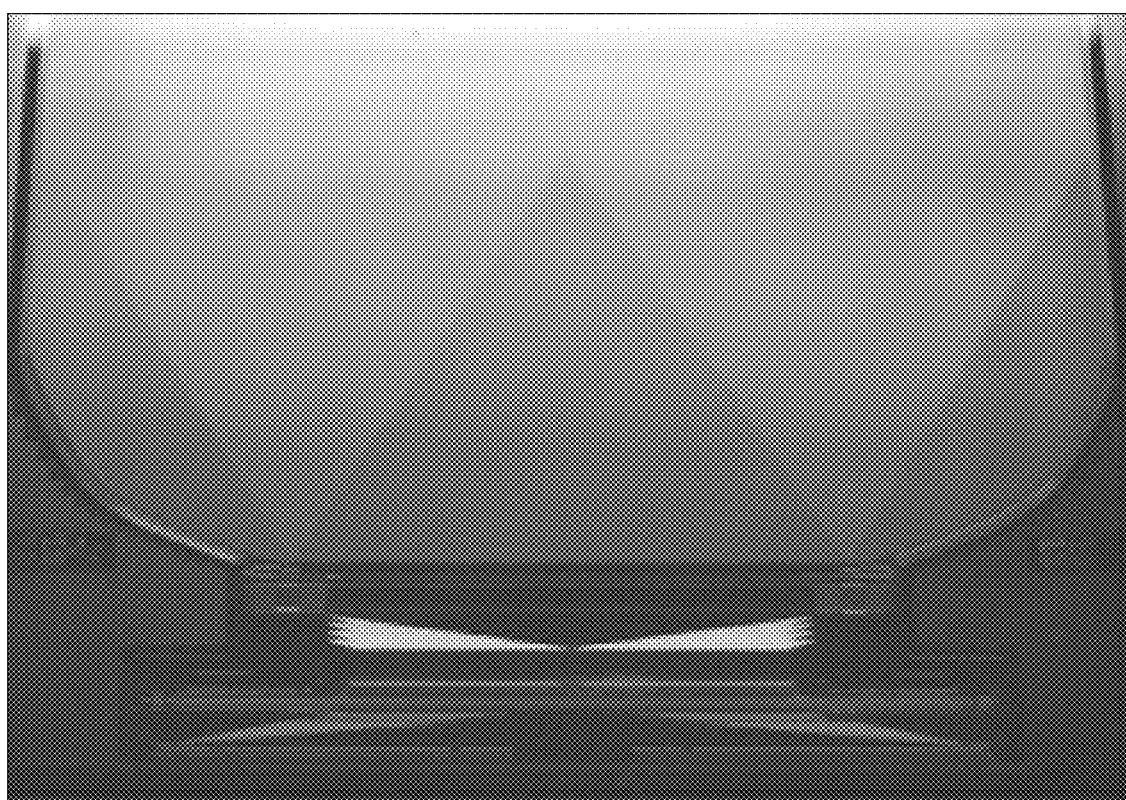
FIG. 12A is a digital picture of the display device manufactured according to Example 1.
Figure 12B:
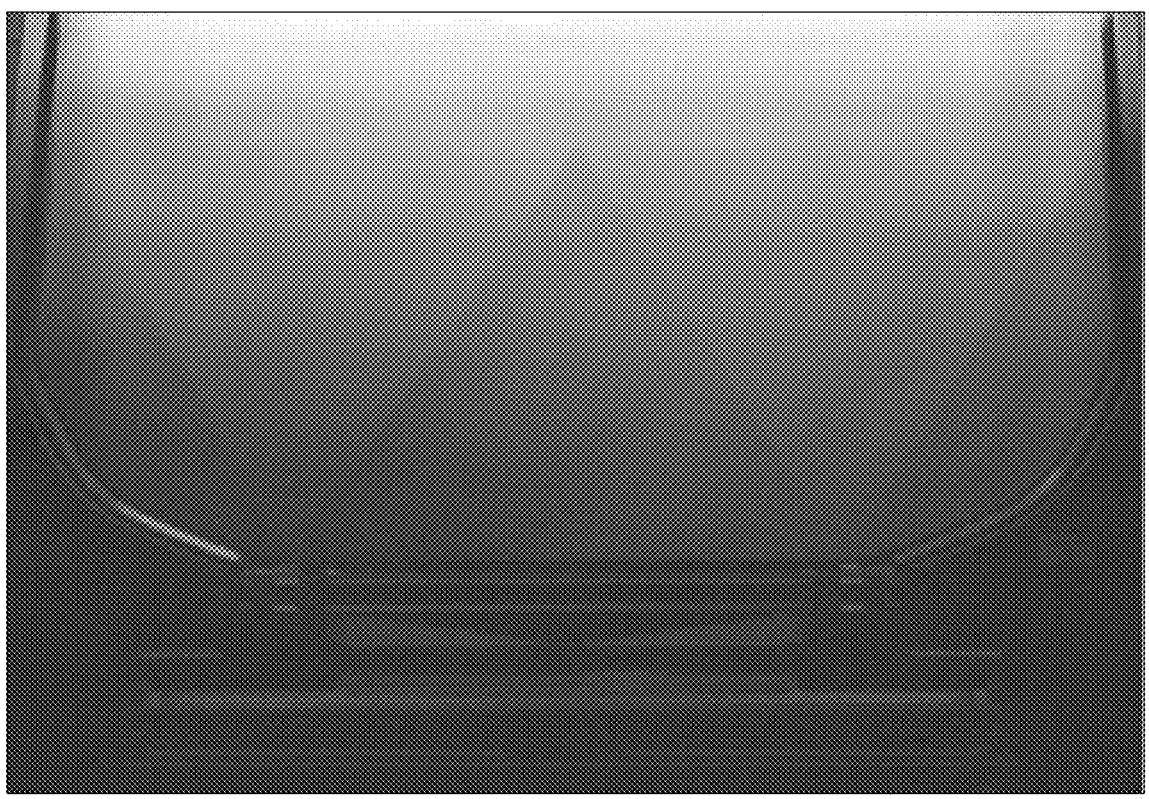
FIG. 12B is a digital picture of the display device manufactured according to Example 2.
Figure 12C:
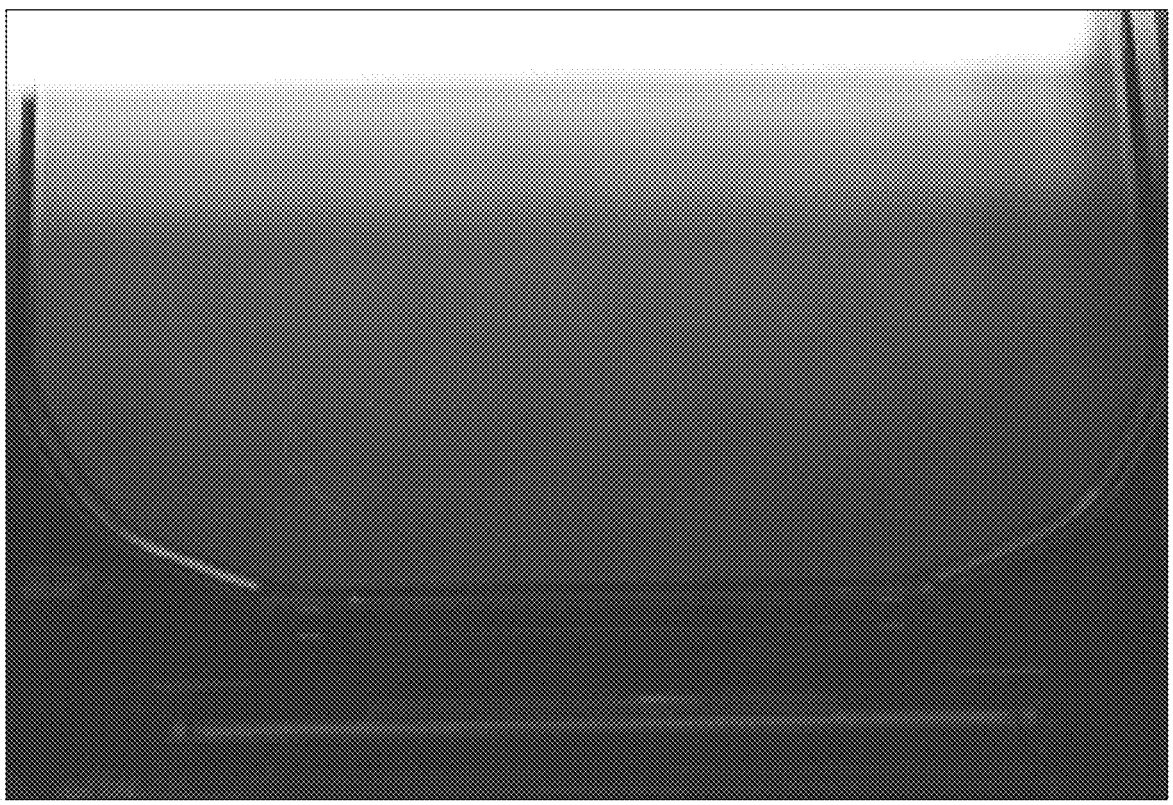
FIG. 12C is a digital picture of the display device manufactured according to Example 3.

FIG. 12A is a digital picture of the display device manufactured according to Example 1. FIG. 12B is a digital picture of the display device manufactured according to Example 2. FIG. 12C is a digital picture of the display device manufactured according to Example 3.

Referring to Table 1 and FIGS. 12A to 12C, it may be noted that a perceived pattern may be reduced by increasing a thickness of the via insulation layer disposed between the first electrode and the conductive pattern including the connection wiring and may be reduced by the via insulation layer having a double-layered structure.

Figure 13:
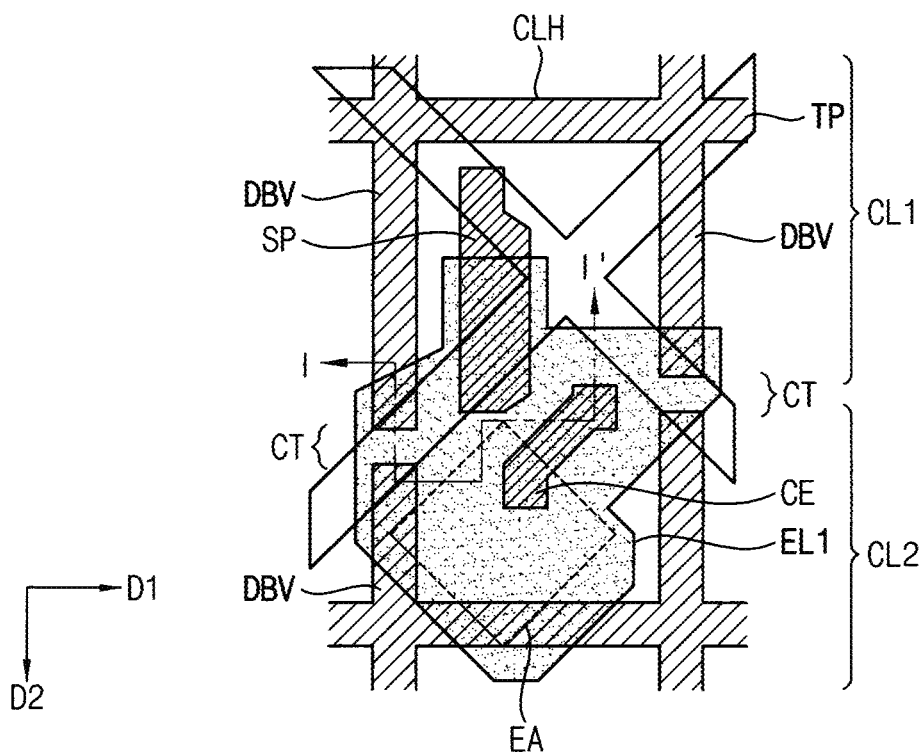
FIG. 13 is a plan view illustrating a pixel area of a display device according to an embodiment.
Figure 14:
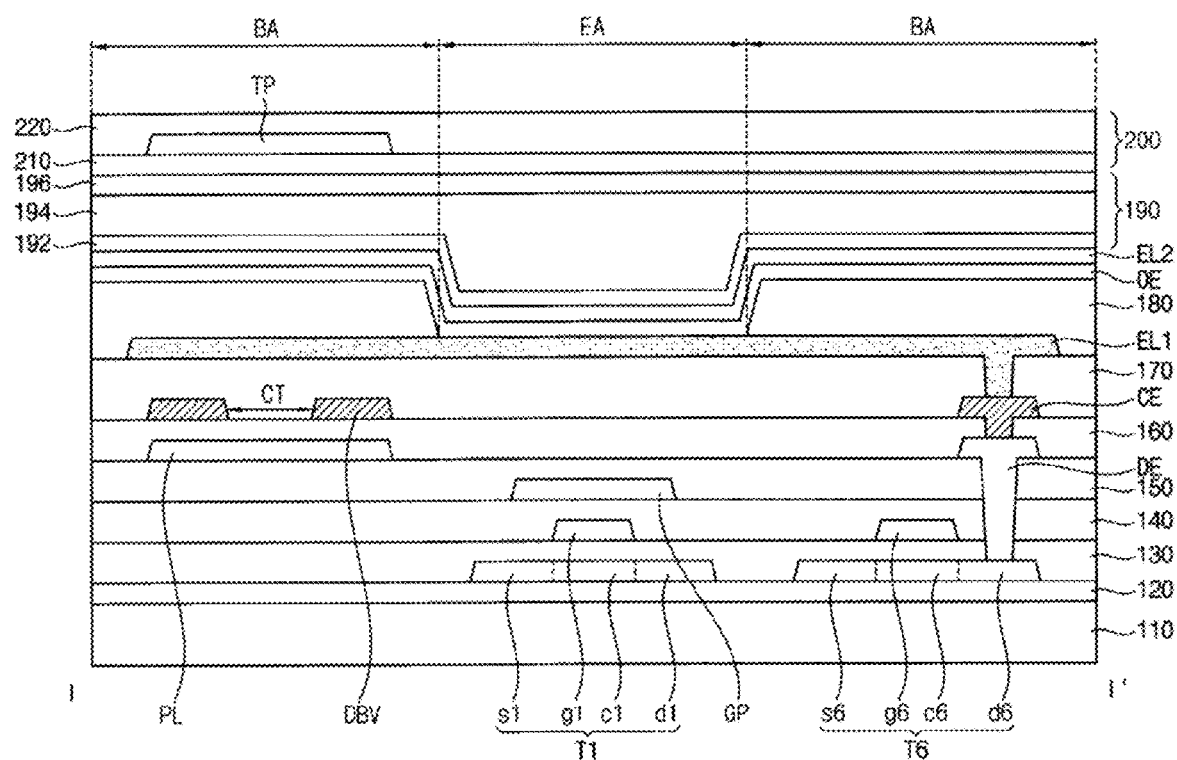
FIG. 14 is a schematic cross-sectional view taken along the line I-I' of FIG. 13.

FIG. 13 is a plan view illustrating a pixel area of a display device according to an embodiment. FIG. 14 is a schematic cross-sectional view taken along the line I-I' of FIG. 13. As an example, FIG. 13 may illustrate a pixel area wherein a connection wiring may extend in a first direction.

Referring to FIGS. 13 and 14, a display device may include connection wirings passing through a first display area to transfer a driving signal to a signal wiring disposed in a second display area.

For example, a first connection wiring CL1 may include a first signal-transferring portion CLH, which may extend in a first direction D1, and a first dummy portion DBV, which may extend in a second direction D2 substantially perpendicular to the first direction D1. The first dummy portion DBV may extend from the first signal-transferring portion CLH in the second direction D2. For example, the first dummy portion DBV may extend from the first signal-transferring portion CLH in both directions substantially perpendicular to the first signal-transferring portion CLH.

A second connection wiring CL2 may be adjacent to the first connection wiring CL1 in the second direction D2. The second connection wiring CL2 may include a first signal-transferring portion CLH, which may extend in the first direction D1, and a first dummy portion DBV, which may extend from first signal-transferring portion CLH toward the first connection wiring CL1. A gap between the first dummy portion DBV of the first connection wiring CL1 and the first dummy portion DBV of the second connection wiring CL2 may define a disconnection portion CT.

The display device may include a driving element, a light-emitting element electrically connected to the driving element, an encapsulation layer 190 covering or overlapping the light-emitting element and a touch-sensing part 200 disposed on the encapsulation layer 190. For example, the touch-sensing part 200 may sense an external input by detecting a variation of a capacitance, thereby obtaining coordinate information of the external input.

For example, the touch-sensing part 200 may include a lower touch insulation layer 210, a first sensing conductive pattern TP and a protective layer 220. In an embodiment, the first sensing conductive pattern TP may have a mesh shape formed by lines extending in different direction to cross or intersect each other.

For example, the first sensing conductive pattern TP may include a metal, a conductive metal oxide, a conductive polymer, graphene, carbon nano tube, or a combination thereof. For example, the metal may include molybdenum, silver, titanium, copper, aluminum, or an alloy thereof. For example, the metal may be provided or disposed to have a shape of a continuous thin film or a nano wire. For example, the conductive metal oxide may include indium tin oxide, indium zinc oxide, zinc tin oxide, indium oxide, zinc oxide, tin oxide, or a combination thereof. The first sensing conductive pattern TP may have a single-layer structure or a multi-layered structure including different materials.

The touch-sensing part 200 may include a second sensing conductive pattern. For example, the second sensing conductive pattern may include a bridge connecting sensing electrodes of the first sensing conductive pattern TP to each other. For example, the second sensing conductive pattern may be disposed under or below the first sensing conductive pattern TP. An interlayer insulation layer may be disposed between the first sensing conductive pattern TP and the second sensing conductive pattern.

In an embodiment, the first sensing conductive pattern TP of the touch-sensing part 200 may overlap a disconnection portion CT of the connection wirings in a plan view. Thus, a perceived pattern due to the disconnection portion CT may be prevented and/or reduced.

A width of the first sensing conductive pattern TP may be greater than a width of the disconnection portion CT to prevent a pattern being perceived with various view angles.

Furthermore, the first sensing conductive pattern TP may overlap a disconnection portion CT of the dummy wirings DM1 and DM2 illustrated in FIG. 5A.

Figure 15:
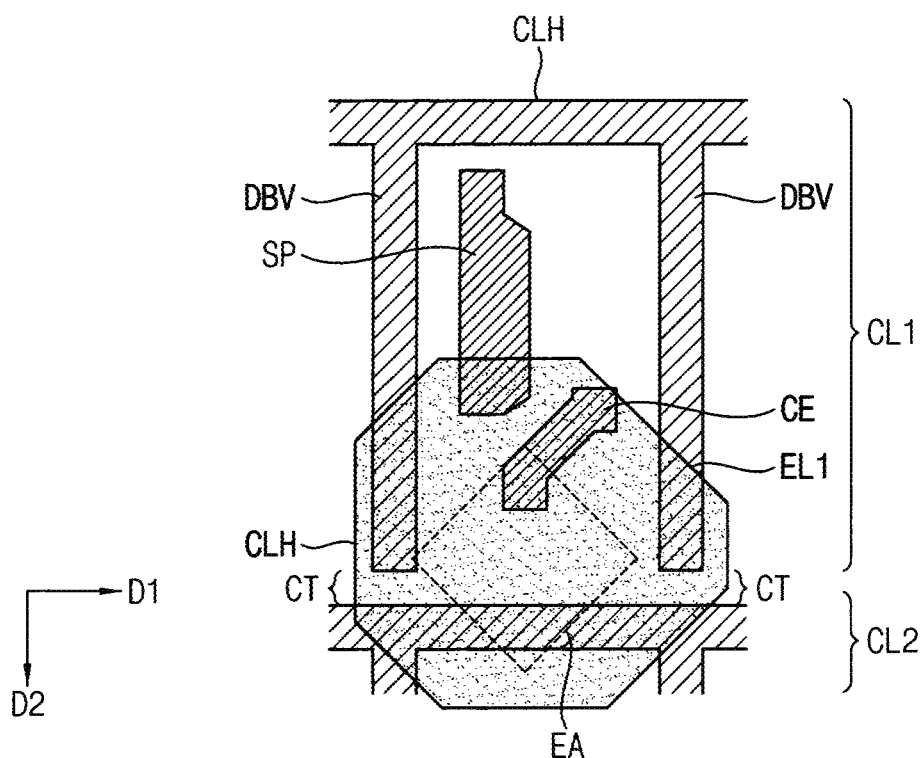
FIG. 15 is a plan view illustrating a pixel area of a display device according to an embodiment.

FIG. 15 is a plan view illustrating a pixel area of a display device according to an embodiment.

Referring to FIG. 15, a disconnection portion CT of connection wirings may be defined by a gap between a dummy portion and a signal-transferring portion.

For example, a first connection wiring CL1 may include a first signal-transferring portion CLH, which may extend in a first direction D1, and a first dummy portion DBV, which may extend in a second direction D2 substantially perpendicular to the first direction D1. The first dummy portion DBV may extend from the first signal-transferring portion CLH in the second direction D2.

A second connection wiring CL2 may be adjacent to the first connection wiring CL1 in the second direction D2. The second connection wiring CL2 may include a first signal-transferring portion CLH, which may extend in the first direction D1, and a first dummy portion DBV, which may extend in a direction opposing the first connection wiring CL1. Thus, a disconnection portion CT may be defined by a gap between the first dummy portion DBV of the first connection wiring CL1 and the first signal-transferring portion CLH of the second connection wiring CL2.

A first electrode EL1 of a light-emitting element electrically connected to a driving element may be expanded to overlap the disconnection portion CT between the first dummy portion DBV of the first connection wiring CL1 and the first signal-transferring portion CLH of the second connection wiring CL2.

As explained in the above, a position of a disconnection portion of connection wirings may be variously changed. Thus, a pixel electrode (first electrode) of a light-emitting element may have various shapes to cover or overlap the disconnection portion.

As explained in the above, a display device according to an embodiment may have a side display area. However, embodiments are not limited thereto. For example, embodiments may include a display device having only a flat display area or a foldable display device.

The above embodiments provide an organic-light emitting display device. However, embodiments are not limited thereto. For example, embodiments may include various display devices such as a liquid crystal display device, a electroluminescent display device, a micro LED display device or the like within the spirit and the scope of the disclosure.

Embodiments may be applied to various display devices. For example, embodiments may be applied to a vehicle-display device, a ship-display device, an aircraft-display device, portable communication devices, display devices for display or for information transfer, a medical-display device, and other devices within the spirit and the scope of the disclosure.

The foregoing is illustrative of embodiments and is not to be construed as limiting thereof. Although embodiments have been described, those skilled in the art will readily appreciate that many modifications are possible in the embodiments without materially departing from the novel teachings and aspects of the disclosure. Accordingly, all such modifications are intended to be included within the scope of the disclosure. Therefore, it is to be understood that the foregoing is illustrative of various embodiments and is not to be construed as limited to the embodiments disclosed, and that modifications to the disclosed embodiments, as well as other embodiments, are intended to be included within the scope of the disclosure, as set forth in the following claims and equivalents thereof.

What is claimed is:

1. A display device comprising:
    a first display area and a second display area adjacent to the first display area in a first direction;
    pixel circuits, each of the pixel circuits including at least one transistor;
    light-emitting elements including a pixel electrode electrically connected to a corresponding one of the pixel circuits;
    signal wirings that transfer a driving signal to the pixel circuits; and
    connection wirings that transfer a driving signal to signal wirings disposed in the second display area, at least one of the connection wirings including:
        a first signal-transferring portion extending in the first direction;
        a second signal-transferring portion extending in a second direction; and
        dummy portions extending in a direction intersecting the first and second signal-transferring portions,
    wherein the pixel electrode overlaps a gap between dummy portions of adjacent connection wirings in an area where the connection wirings are disposed.

2. The display device of claim 1, further comprising:
    dummy wirings disposed in an area where the connection wirings are not disposed,
    wherein at least one of the dummy wirings include extending portions extending in the first direction and in the second direction.

3. The display device of claim 2, wherein the pixel electrode overlaps a gap between extending portions of adjacent dummy wirings in the area where the dummy wirings are disposed.

4. The display device of claim 2, wherein the connection wirings and the dummy wirings are disposed in a same layer.

5. The display device of claim 2, wherein a constant voltage is applied to the dummy wirings.

6. The display device of claim 1, wherein a width of the gap is in a range of about 1 μm to about 5 μm.

7. The display device of claim 1, further comprising:
    a driving voltage line overlapping a portion of the connection wirings and extending in the second direction.

8. The display device of claim 1, further comprising:
    an organic insulation layer disposed between the pixel electrode and the connection wirings,
    wherein a thickness of the organic insulation layer is in a range of about 20,000 Å to about 35,000 Å.

9. The display device of claim 8, wherein the organic insulation layer includes a lower insulation layer and an upper insulation layer.

10. The display device of claim 1, wherein the signal wirings transfer a data signal to the pixel circuits.

11. The display device of claim 1, wherein the signal wirings are disposed below the connection wirings.

12. The display device of claim 1, further comprising:
    a touch-sensing part disposed on the light-emitting elements and including a sensing conductive pattern,
    wherein the sensing conductive pattern overlaps the gap.

13. The display device of claim 12, wherein a width of the sensing conductive pattern is greater than a width of the gap.

14. The display device of claim 1, further including pad electrodes adjacent to the first display area in the second direction,
    wherein the connection wirings are electrically connected to the pad electrodes.

15. The display device of claim 1, wherein the second display area displays an image in a direction different from the first display area.

16. A display device comprising:
    a first display area and a second display area adjacent to the first display area in a first direction;
    pixel circuits, each of the pixel circuits including at least one transistor;
    light-emitting elements including a pixel electrode electrically connected to a corresponding one of the pixel circuits;

signal wirings that transfer a driving signal to the pixel circuits; and connection wirings that transfer driving signals to signal wirings disposed in the second display area, at least one of the connection wirings including a signal-transferring portion and a dummy portion, the signal-transferring portion and the dummy portion extending in different directions to form a matrix having a disconnection portion, wherein the pixel electrode overlaps the disconnection portion in an area where the connection wirings are disposed.

17. The display device of claim 16, wherein a gap between a dummy portion of a first connection wiring and a signal-transferring portion of a second connection wiring adjacent to the first connection wiring is the disconnection portion.

18. The display device of claim 16, wherein a gap between a dummy portion of a first connection wiring and a dummy portion of a second connection wiring adjacent to the first connection wiring is the disconnection portion.

19. The display device of claim 16, wherein
at least one of the connection wirings include:
  a first signal-transferring portion extending in the first direction; and
  a second signal-transferring portion extending in a second direction, and
the dummy portion extends in a direction perpendicular to at least one of the first signal-transferring portion and the second signal-transferring portion.

20. The display device of claim 16, further comprising:
dummy wirings disposed in an area where the connection wirings are not disposed,
wherein at least one of the dummy wirings include extending portions extending in different directions to form a matrix having a disconnection portion.

21. The display device of claim 20, wherein the pixel electrode overlaps the disconnection portion of the dummy wirings in the area where the dummy wirings are disposed.

22. The display device of claim 20, wherein the connection wirings and the dummy wirings are disposed in a same layer.

23. The display device of claim 20, wherein a constant voltage is applied to the dummy wirings.

24. The display device of claim 20, further comprising:
an organic insulation layer disposed between the pixel electrode and the connection wirings,
wherein a thickness of the organic insulation layer is in a range of about 20,000 Å to about 35,000 Å.

25. The display device of claim 24, wherein the organic insulation layer includes a lower insulation layer and an upper insulation layer.

26. The display device of claim 16, further comprising:
a touch-sensing part disposed on the light-emitting elements and including a sensing conductive pattern,
wherein the sensing conductive pattern overlaps the disconnection portion.

* * * * *